United States Patent
Höhn et al.

(10) Patent No.: US 7,455,461 B2
(45) Date of Patent: Nov. 25, 2008

(54) OPTOELECTRONIC COMPONENT AND METHOD FOR THE PRODUCTION THEREOF

(75) Inventors: Klaus Höhn, Taufkirchen (DE); Jörg Sorg, Pentling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/275,786

(22) PCT Filed: May 11, 2001

(86) PCT No.: PCT/DE01/01820

§ 371 (c)(1),
(2), (4) Date: Jan. 16, 2003

(87) PCT Pub. No.: WO01/86730

PCT Pub. Date: Nov. 15, 2001

(65) Prior Publication Data
US 2003/0185526 A1    Oct. 2, 2003

(30) Foreign Application Priority Data
May 12, 2000   (DE)   .................... 10023353

(51) Int. Cl.
*G02B 6/36* (2006.01)
(52) U.S. Cl. .............. 385/93; 385/48; 385/80
(58) Field of Classification Search ........... 385/48, 385/80, 93
See application file for complete search history.

(56) References Cited

U.S. PATENT DOCUMENTS

| | | | |
|---|---|---|---|
| 4,727,457 A * | 2/1988 | Thillays | 362/582 |
| 5,043,716 A | 8/1991 | Latz et al. | |
| 5,450,513 A * | 9/1995 | Bookbinder et al. | 385/48 |
| 6,019,523 A * | 2/2000 | Honmou | 385/94 |
| 6,478,477 B1 * | 11/2002 | Yamaguchi | 385/80 |
| 6,517,259 B1 * | 2/2003 | Murata | 385/92 |
| 6,576,930 B2 * | 6/2003 | Reeh et al. | 257/98 |
| 6,610,563 B1 * | 8/2003 | Waitl et al. | 438/166 |
| 6,642,068 B1 * | 11/2003 | Hayes et al. | 438/21 |
| 2002/0118917 A1 * | 8/2002 | Kawai | 385/31 |

FOREIGN PATENT DOCUMENTS

| | | |
|---|---|---|
| DE | 2904626 | 8/1979 |
| DE | 8812039.2 | 2/1989 |

(Continued)

OTHER PUBLICATIONS

Beyer, W., "Lehrbuch der Organischen Chemie" 21. Auflage S. 34. S. Hirzel Verlag. Stuttgart 1988.

(Continued)

*Primary Examiner*—Frank G Font
*Assistant Examiner*—Eric Wong
(74) *Attorney, Agent, or Firm*—Fish & Richardson P.C.

(57) ABSTRACT

To secure an optical lens over an optoelectronic transmitter or receiver, it is proposed to use a UV-initiated or photoinitiated, cationically curing epoxy resin, by means of which the bonded joint can be set and thereby fixed in a few seconds. Also proposed, for use as adhesives, are resin compositions that can be applied as liquids, are optically matched, and are optimized for durable, reliable use in optoelectronic components and for the large-scale manufacture thereof.

40 Claims, 2 Drawing Sheets

FOREIGN PATENT DOCUMENTS

Figure 2A:
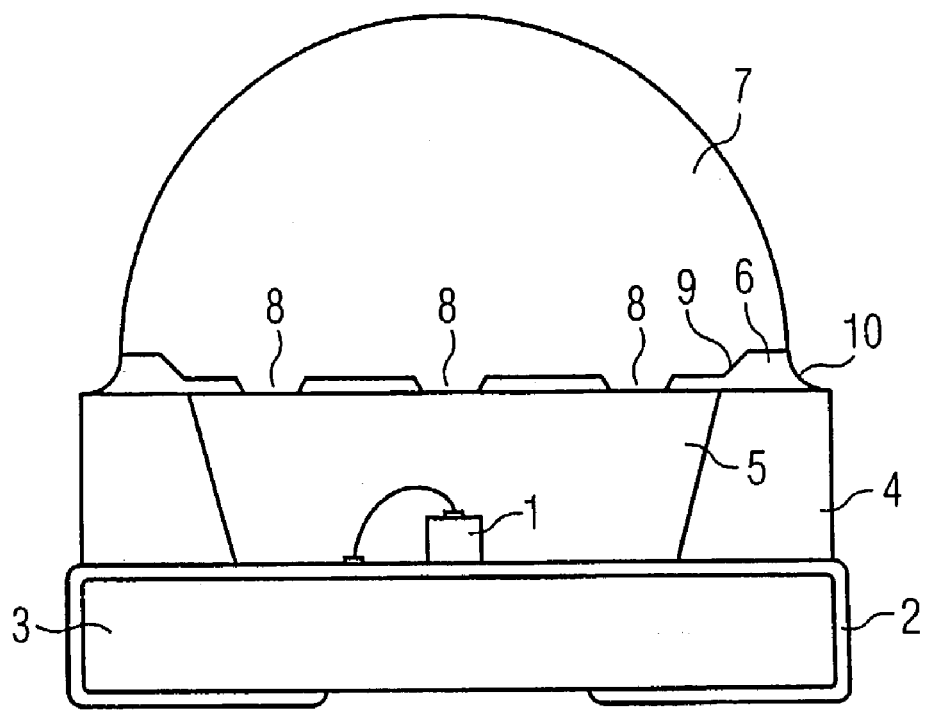

| | | |
|---|---|---|
| DE | 19755734 | 6/1999 |
| DE | 19851139 | 5/2000 |
| DE | 19918370 | 11/2000 |
| EP | 62060277 | 3/1987 |
| EP | 04010670 | 1/1992 |
| EP | 0 635 744 A2 | 1/1995 |
| EP | 0911886 | 4/1999 |
| EP | 2000111721 | 4/2000 |
| JP | 9-27643 | 1/1997 |
| JP | 9-83018 | 3/1997 |

OTHER PUBLICATIONS

Möllmer, F. et al., "Siemens SMT-Topled für die Oderflächenmontage" *Siemens Components*, vol. 29, Heft 5. pp. 193-196: 1991.

Produkt-Information. "Superhelle Leuchtdioden Erobern Neue KFZ-Anwendungen. Power Topled Ersetzen Kleinglühlampen", *Siemens Components*, vol. 34. Heft 4. S. 1-11: 1996.

\* cited by examiner

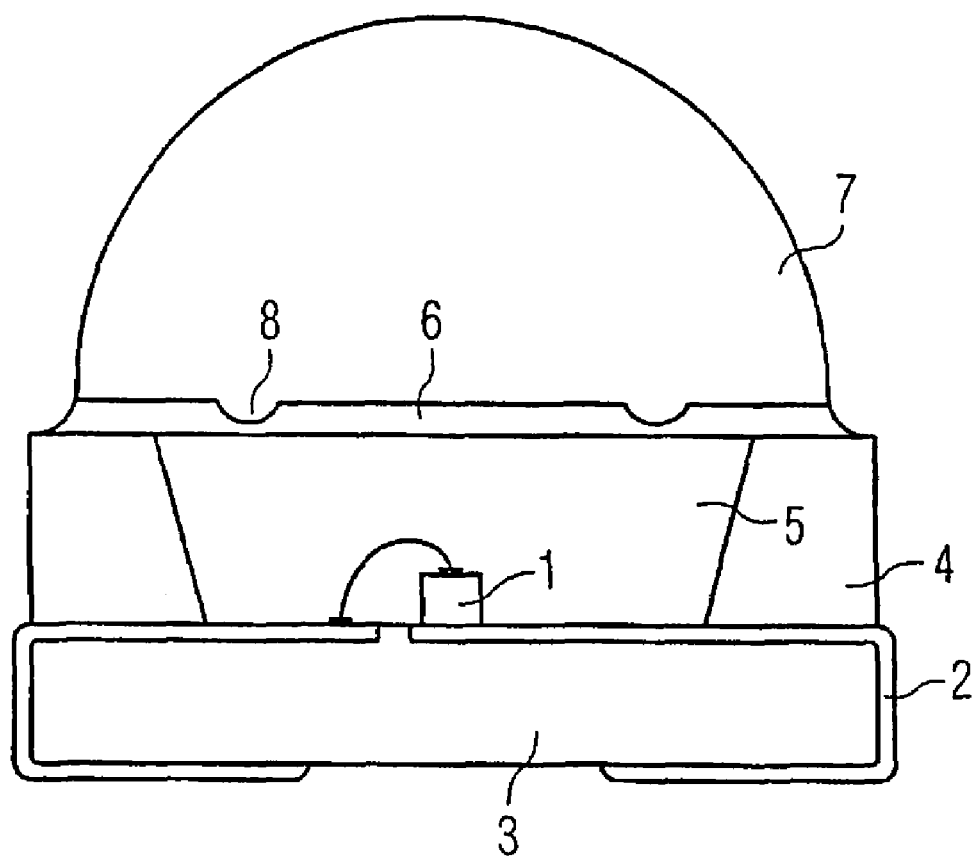

OPTOELECTRONIC COMPONENT AND METHOD FOR THE PRODUCTION THEREOF

The invention concerns an optoelectronic component comprising a support body on which an optoelectronic transmitter or receiver is arranged, comprising a transparent layer placed over and encapsulating the transmitter or receiver, and comprising an optical element arranged over the transparent layer.

Such a component is known, for example, from DE 19755734 A 1. Described therein is an SMD-mountable optoelectronic component assembled on a support body provided with a recess. The optoelectronic transmitter or receiver is arranged in the recess and encapsulated with an optically matched transparent plastic layer. Arranged over the transparent plastic layer and in direct contact therewith is a lens, serving as the optical element, by means of which the incidence of light on or radiation of light from the component is controlled. A transparent casting compound is used for the plastic layer, the lens being placed on the plastic layer before said casting compound has cured completely. Curing of the casting compound results both in good optical contact and in a good bond between the plastic layer and the optical lens.

This approach has the disadvantages that precise orientation of the lens is difficult and the lens has to be fixed relative to the base body or support body during cure. Since this fixation must be maintained for the entire curing time, which, depending on the plastic used, can be up to several minutes and hours [sic], this complicates the production of the optoelectronic component.

The object of the present invention is, therefore, to provide an optoelectronic component in which an optical element such as a lens, for example, can be oriented and fixed simply and reliably.

This object is achieved according to the invention by means of a component of the type cited at the beginning hereof, with the aid of the features of Claim 1. Advantageous embodiments of the invention and a method for achieving precision-fit bonding will emerge from additional claims.

The invention proposes bonding the optical element to a transparent layer by means of an adhesive layer composed of a single-component resin. By means of the invention, the plastic layer used as the transparent layer can be cured, and, optionally, its surface treated, independently of the optical element. The single-component resin of the adhesive layer enables the optical element to be mounted on the transparent layer in a simple manner.

A UV-initiated or photoinitiated, cationically cured epoxy resin is preferably used as the adhesive layer. Resins with this curing mechanism have the advantage that in a rapid photoinitiated or UV-initiated process, they pass into a gel phase that in itself is sufficient for prefixation. Using such a resin as an adhesive therefore permits rapid fixation of the parts to be bonded. Complete cure of the prefixed parts can then take place in a further step without the need for any additional remedial measures such as fixations.

Under these circumstances, curing can take place in a few seconds. It is even feasible to use only a flash of light or ultraviolet to initiate cure. This is sufficient to fix the to-be-bonded parts so firmly that their mutual orientation is maintained during complete curing, which can take place at an arbitrary later time. Rapid and exact fixation of the parts to be bonded is therefore feasible, which is especially important in the case of optical systems.

The rapid setting of cationically curing resin has the further advantage that is can be carried out at any desired temperature, which can be selected with a view toward the subsequent use of the bonded assembly and, in particular, the subsequent operating temperature of the optoelectronic component. The preferred approach is to perform the radiation-induced preset of the adhesive layer at the lowest possible temperatures, particularly at temperatures of 60° C. or less. This prevents any thermal stresses that might be induced in the bonded joint by thermal expansion during curing at high temperatures. A low-stress bond is also more stable and can be made in a reproducible manner. Any material properties that may depend on the existing thermomechanical load can therefore be adjusted constantly and reproducibly. This approach also allows the complete cure to be performed at any later time that may be desired.

The chemical and geometric structure of the adhesive layer is also selected so that, under the temperature, moisture and radiation loads that have to be given greater consideration in the case of optoelectronic components, the adhesive layer will neither yellow nor become cloudy, nor will its mechanical and mechanical [sic] properties deteriorate. This also ensures that there will be no decrease in luminous efficiency or change in the radiation characteristic. In addition, the mechanical strength of the adhesive layer is not decreased in response to said loads. Thus, the operating ability is certain to last for the duration of production, qualification, and the ten years of operating time or service life that is standard for LEDs. The adhesive layer and thus the optoelectronic component or LED are able to meet the exacting qualification requirements of the automotive industry.

Through suitable choice of the resin components, it is also feasible to obtain a resin with a sufficiently high glass transition temperature $T_G$ of, for example, 120° C. or more. This ensures that a component bonded with this resin will function reliably at operating temperatures below the glass transition temperature. This high $T_G$ also persists over the service life of the component, without decreasing under temperature, light or moisture loading.

Once the resin has cured completely, it exhibits no optical inhomogeneities of any kind, neither air inclusions nor cracks, tears or delamination of any kind. The adhesive and thus also the adhesive bond is sufficiently temperature-stable and withstands the solder-bath conditions required for SMD assembly of the SMD component without incurring any damage or tendency to malfunction.

The cured adhesive layer can be adjusted to an index of refraction $n_D$ of more than 1.50. It is thus ideally matched optically to the optical molding materials that are preferably used for the optical element.

In the bonding of transparent parts, as in the case of the present invention, irradiation with UV or visible light that passes through the parts to be bonded results in exposure of the entire volume of the adhesive layer, and setting/cure is therefore initiated uniformly throughout. This can be achieved even at very low irradiances of less than 100 mW/cm$^2$.

The resin can be matched rheologically so as to permit micrometering at 60° C. with a metering tolerance of <±3%, enabling the adhesive layer to be applied exactly and reproducibly in a thin layer thickness of, for example, up to 100 μm, with good adhesive properties for the adhesive bond. The bonding process is laid out so that it can be performed with high throughputs in large-scale, highly automated production. This is achieved in particular by means of the fast setting times with which the lens becomes fixed to the plastic layer.

For the component according to the invention, it is preferable to use an epoxy resin system that can be applied as a liquid and that can have the following general composition, stated in weight-percent:

| | |
|---|---|
| Bi- and multifunctional epoxy resin | 80-99% |
| Monofunctional epoxy resin (reactive diluent, monoglycidyl ether) | 0-10% |
| (Poly-)vinyl ether | 0-20% |
| Aliphatic or cycloaliphatic alcohol | 0-10% |
| Bonding agent (organofunctional alkoxysilane) | 0-5% |
| Flow agent, preferably silicon- or acrylate-based | 0-1% |
| Deaerator, preferably silicon- or acrylate-based | 0-1% |
| Catalyst for UV-initiated cationic curing | 0.1-2% |

The photoinitiator used for the cationic cure can be, for example, UVI6974 (CIBA SC). For the subsequent thermal cure, additional initiators can be used to effect a cationically initiated thermal cure. Halonium and onium salts of sulfur (sulfonium salts) are preferably used for this purpose. A suitable thermal initiator is, for example, S-benzylthiolanium hexafluoroantimonate (Aldrich).

The invention will now be described in more detail with reference to exemplary embodiments in combination with FIGS. 1 and 2.

Figure 2B:
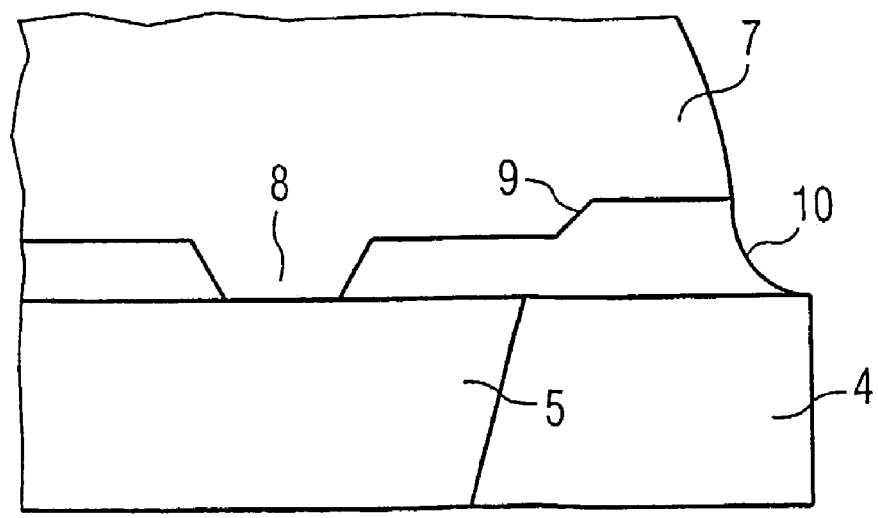

In the drawing:

FIG. 1 is a schematic cross-sectional representation of a first exemplary embodiment of a component according to the invention, and FIGS. 2a and 2b are, respectively, a schematic cross-sectional representation and a detailed view of a second exemplary embodiment of a component according to the invention.

Like or like-acting elements have been assigned the same reference numerals in the figures.

The base body for the component depicted in FIG. 1 is formed by extrusion-layer a conductive strip 2 with a high-temperature thermoplastic, shaping a package 3 therefrom. The package has at its center a recess, in which the optical transmitter or receiver is arranged and is connected electrically to the conductive strip from which the SMD-capable contacts are fabricated. The recess in the package preferably has inclined lateral faces 4 that can therefore serve as reflectors for the optoelectronic component.

After the optical transmitter or receiver 1 has been mounted and contacted in the recess, the latter is filled with a flowable casting compound, which is then cured to yield a plastic layer 5 that encapsulates the transmitter or receiver. A thin layer 6 of a UV-initiated, cationically curing epoxy resin is then applied to the plastic layer 5 in a layer thickness of, for example, 90 µm. Placed on this resin layer 6, which forms the subsequent bonding layer, is the optical lens 7, as the optical element, which is oriented and is optionally fixed briefly in its exact position.

The joint surface of the optical element is preferably provided with structures 8 to improve the mechanical keying of the surfaces to be bonded. These can, for example, be lugs, nubs or similarly shaped projections or indentations. A topology that is sawtooth-like in cross section is also feasible. Such structures can be shaped on the joint surface, for example.

In addition, the lens, or, generally, the optical element, can have on its joint side a surface topology (not shown) that deviates from the planar. In particular, this can be a defined roughness or waviness.

In order to orient the to-be-bonded parts in an exact and reproducible spacing from one another, it is advantageous to dispose spacing elements or spacers between the joint surfaces. These can be part of one of the joint surfaces and can, for example, be formed on the optical element.

To enable the radiation characteristic to be adjusted to specific needs, the lens itself can have not only the convex geometry shown, but also a planarly parallel or a concave incident surface and various radii of curvature.

After the optical element has been oriented, the entire arrangement is exposed briefly from above to UV radiation, for example a UV flash. After a few seconds, particularly after a period of 0.1 to 5 seconds, the optical lens 7 is sufficiently fixed on the plastic layer 5 and the adhesive layer 6 is sufficiently set.

In a second step, the adhesive layer 6 is then cured completely, for example for two hours at a temperature of 120° C.

The following compositions, stated in parts by weight (pbw), are selected for the UV-initiated, cationically cured epoxy resin used according to the invention.

EXAMPLE a

| | |
|---|---|
| Bisphenol A epoxy cast resin GY260 | 88.9 pbw |
| Epoxynovolak D.E.N. 438 | 10.9 pbw |
| Tego-DF48 (a bonding agent) | 0.4 pbw |
| Initiator UVI6974 | 1.0 pbw |

EXAMPLE b

| | |
|---|---|
| Bisphenol A epoxy cast resin GY260 | 88.9 pbw |
| Epoxynovolak D.E.N. 438 | 10.0 pbw |
| BYKA506 | 0.4 pbw |
| Initiator UVI6974 | 0.7 pbw |

The optoelectronic components obtained with both epoxy resin compositions, a and b, have adhesive layers that are so stable against temperature, moisture and radiation loading under the potential operating conditions of the component that they do not exhibit either yellowing, clouding or any other change that might decrease luminous efficiency or alter the radiation characteristic. The resin compositions are able to set in a few seconds and demonstrate sufficient bonding strength after complete cure. They survive solder-bath conditions of 3×260° C. without damage and with no reduction of the thermomechanical properties of the adhesive layer.

A further modification, not described in the exemplary embodiments, concerns the addition of a given quantity of vinyl ethers to further shorten the setting time. This expedites the setting process and thus further increases throughput in the production of the optoelectronic components. In addition, the other ingredients can be selected for ideal optical matching to the plastic layer, thus eliminating the disadvantage of optical losses at the transition from the plastic layer to the adhesive layer or the transition from the adhesive layer to the lens.

A further exemplary embodiment of a component according to the invention is depicted schematically in cross section in FIG. 2.

In contrast to the first exemplary embodiment, here the lens 7 has on its joint side an obliquity 9, so that the bond gap widens toward the edge of the component. This obliquity 9 can also, for example, be implemented as a circumferential bevel on the joint side of the optical element.

This shaping creates a reservoir for excess adhesive. Due to surface tension, at its edge the adhesive forms a fillet 10, as shown more closely in the detailed view of FIG. 2b. This advantageously reduces the risk that excess adhesive will reach the side walls of the package. It also reduces requirements in terms of the metering accuracy of the adhesive.

Formed on the joint surface of the optical element are lug-like structures 8 that serve as spacers between lens 7 and plastic layer 5. This ensures a defined and consistent thickness for the adhesive layer 6. At the same time, these spacers 8 constitute a keying between the adhesive layer 6 and the lens, which increases the strength of the adhesive bond.

The explanation of the invention with reference to the described exemplary embodiments is, of course, not to be construed as limiting the invention thereto.

The invention claimed is:

1. An optoelectronic component comprising:
   a package having a recess;
   an optoelectronic transmitter or receiver positioned in the recess;
   an encapsulation layer placed over and encapsulating the optoelectronic transmitter or receiver;
   an optical element configured to control the shape of a beam of light incident on the optical element, the optical element arranged over the encapsulation layer and configured such that at least some radiation emitted or received by the transmitter or receiver passes through the optical element and the encapsulation layer;
   an adhesive layer, different from the encapsulation layer and the optical element, applied between the encapsulation layer and the optical element to connect the optical element and the encapsulation layer in a mechanically stable manner, the adhesive layer comprising a UV-initiated or photoinitiated, cationically cured epoxy resin; and
   at least one mechanical keying element positioned between the optical element and the encapsulation layer, the at least one mechanical keying element being positioned over the recess.

2. The component as recited in claim 1, wherein the adhesive layer has a glass transition temperature of more than 100° C.

3. The component as recited in claim 1, wherein the adhesive layer has a refractive index that is optically matched to a refractive index of the encapsulation layer.

4. The component as recited in claim 1, wherein at least one of the encapsulation layer and the optical element are made of glass, of polyacrylate, of polyurethane, or of epoxy resin molding compound.

5. The component as recited in claim 1, wherein the optical element has a surface that faces the encapsulation layer with a defined roughness or waviness.

6. The component as recited in claim 1, wherein the optical element is mechanically keyed to the encapsulation layer by the at least one mechanical keying element.

7. The component as recited in claim 6, where the optical element comprises multiple projections or multiple indentations to mechanically key its bonding to the encapsulation layer.

8. The component as recited in claim 1, comprising spacing elements between the optical element and the encapsulation layer.

9. A method for the precision-fit bonding of transparent parts of an optoelectronic component, comprising the steps of:
   applying a thin resin layer of a cationically initiated, curable epoxy resin to a surface of a transparent part of an optoelectronic component to be bonded,
   placing and orienting a further transparent part on said resin layer,
   exposing the assembly to UV or visible radiation in order to set said resin layer, and further curing said resin layer;
   wherein the thin resin layer is different from both the transparent part and the further transparent part and connects them in a mechanically stable manner.

10. The method as recited in claim 9, wherein the complete cure of said resin layer is performed at elevated temperature.

11. The method as recited in claim 9, wherein the exposing the layer includes exposing the layer to ultraviolet radiation having an average irradiance of less than 100 mW/cm$^2$.

12. The method as recited in claim 9, wherein said exposure to UV radiation is effected by means of a UV flash and the further curing is performed at temperatures above 120° C.

13. The method as recited in claim 9, wherein the cationically initiated, curable epoxy resin includes (a) more than 50% by weight of a diglycidyl ether of bisphenol A and (b) a cation-releasing photoinitiator.

14. The method as recited in claim 9, wherein the cationically initiated, curable epoxy resin includes, stated in weight-percent:
   80 to 99% bi- and multifunctional epoxy resins
   0 to 10% monofunctional epoxy resin
   0-19% vinyl ether
   0-10% aliphatic or cycloaliphatic alcohol
   0-5% bonding agent
   0.1-5% photoinitiator for cationically initiated curing.

15. The component of claim 1, wherein the component is a surface mount device (SMD).

16. A method, comprising:
   providing a package with a recess;
   mounting an optoelectronic transmitted or receiver in the recess;
   completely filling the recess with an encapsulation layer to encapsulate the optoelectronic transmitter or receiver;
   curing the encapsulation layer; and
   bonding an optical element configured to control the shape of a beam of light incident on the optical element to the cured encapsulation layer with an adhesive comprising a UV-initiated or photoinitiated, cationically curable epoxy resin, the adhesive being different from the encapsulation layer and the optical element,
   wherein the adhesive layer is applied between the encapsulation layer and the optical element, and the adhesive layer is configured to connect the optical element and said encapsulation layer in a mechanically stable manner.

17. A method, comprising:
   applying a layer of an epoxy resin to a surface of an encapsulation layer encapsulating an optoelectronic component, the resin comprising a diglycidyl ether of bisphenol A as its chief constituent, wherein the resin is different from the encapsulation layer;
   positioning and orienting an optical element on said resin so that the optical element is arranged to receive radiation transmitted through the resin by the optoelectronic component or direct radiation through the resin to the optoelectronic component; and
   exposing the resin to radiation to at least partially cationically cure the resin; wherein the optical element is connected to the encapsulation layer through the resin in a mechanically stable manner.

18. The method of claim 17, wherein the surface of the optoelectronic component and the optical element each comprise at least one of plastic or glass.

19. The method of claim 18, wherein the optoelectronic component is a surface mount device (SMD).

20. The method of claim 9, wherein the optoelectronic component is a surface mount device (SMD).

21. An optoelectronic component, comprising:
a support body on which an optoelectronic transmitter or receiver is arranged;
an encapsulation layer placed over and encapsulating the optoelectronic transmitter or receiver;
an optical element configured to control the shape of a beam of light incident on the optical element, the optical element arranged over the encapsulation layer; and
an adhesive layer different from the encapsulation layer and the optical element, the adhesive layer applied between the encapsulation layer and the optical element to connect the optical element and the encapsulation layer in a mechanically stable manner, the adhesive layer comprising a UV-initiated or photoinitiated, cationically cured epoxy resin,
wherein the optical element comprises an obliguity formed in a face of the optical element that faces the encapsulation layer, and
wherein the obliquity forms a gap between the face of the optical element and the encapsulation layer, the gap increasing in height along a lateral direction from a center of the optical element toward an edge of the optical element.

22. The component of claim 21, wherein the optical element is configured to couple the radiation between the surroundings and the device through the encapsulation layer.

23. An optoelectronic component comprising:
a package having a recess;
an optoelectronic transmitter or receiver mounted in the recess;
an encapsulation layer placed over and encapsulating the optoelectronic transmitter or receiver, the encapsulation layer completely filling the recess;
an optical element arranged over the encapsulation layer and configured such that at least some radiation emitted or received by the transmitter or receiver passes through the optical element and the encapsulation layer; and
an adhesive layer, different from the encapsulation layer, configured to bond the optical element to the encapsulation layer.

24. The optoelectronic component of claim 1, wherein the encapsulation layer completely fills the recess.

25. The optoelectronic component of claim 1, wherein the adhesive layer is the only mechanically stable connection between the encapsulation layer and the optical element.

26. An optoelectronic component comprising:
a support body on which an optoelectronic transmitter or receiver is arranged;
an encapsulation layer placed over and encapsulating the optoelectronic transmitter or receiver;
a lens configured to control the shape of a beam of light incident on the lens, wherein the lens is arranged over the encapsulation layer and configured such that at least some radiation emitted or received by the transmitter or receiver passes through the lens and the encapsulation layer, and wherein the lens has a planar face that faces the encapsulation layer and the encapsulation layer has a planar face that faces the lens; and
an adhesive layer, different from the encapsulation layer and the lens, applied between the planar face of the encapsulation layer and the planar face of the lens to connect the lens and the encapsulation layer in a mechanically stable manner, the adhesive layer comprising a UV-initiated or photoinitiated, cationically cured epoxy resin.

27. The optoelectronic component of claim 1, wherein the adhesive layer is substantially planar.

28. The optoelectronic component of claim 27, wherein the adhesive layer has a thickness of 100 µm or less.

29. The optoelectronic component of claim 3, wherein the adhesive layer has a refractive index n>1.5.

30. The optoelectronic component of claim 1 wherein the adhesive layer is configured to connect the optical element and the encapsulation layer in a mechanically stable manner 5 seconds or less after exposure to a UV flash.

31. The optoelectronic component of claim 1, wherein the optical element represents a lens.

32. The method of claim 9, wherein the adhesive layer has a thickness of 100 µm or less.

33. The optoelectronic component of claim 1 wherein the adhesive layer is transparent.

34. The optoelectronic component as recited in claim 1, wherein the at least one mechanical keying element comprises at least one protrusion extending outward from a face of the optical element that faces the encapsulation layer, and at least one depression formed in the adhesive layer, the at least one depression being configured to receive the at least one protrusion.

35. The optoelectronic component as recited in claim 1, wherein the at least one mechanical keying element comprises at least one protrusion that extends outward from a face of the optical element that faces the encapsulation layer, and contacts the encapsulation layer.

36. The method of claim 16, wherein completely filling the recess with an encapsulation layer comprises filling the recess to an upper edge of the recess with the encapsulation layer.

37. The optoelectronic component of claim 21, wherein the obliquity comprises a circumferential bevel formed in the face of the optical component that faces the encapsulation layer.

38. The optoelectronic component of claim 23, wherein the adhesive layer has a glass transition temperature of more than 100° C.

39. The optoelectronic component of claim 23, wherein completely filling the recess comprises filling the recess to an upper edge of the recess.

40. The optoelectronic component of claim 24, wherein completely filling the recess comprises filling the recess to an upper edge of the recess.

* * * * *

UNITED STATES PATENT AND TRADEMARK OFFICE
CERTIFICATE OF CORRECTION

PATENT NO. : 7,455,461 B2  Page 1 of 1
APPLICATION NO. : 10/275786
DATED : November 25, 2008
INVENTOR(S) : Klaus Höhn and Jörg Sorg It is certified that error appears in the above-identified patent and that said Letters Patent is hereby corrected as shown below:

<u>Title Page</u>
First Column, (73) Assignee: replace
 "Osram Opto Semiconductors GmbH, Regensburg (DE)" with
 --Osram GmbH, Munich (DE)--

<u>Title Page 2</u>
First Column, Foreign Patent Documents, replace
 "EP 62060277 2/1987" with --JP 62-060277 2/1987--
 "EP 2000111721 4/2000" with --JP 2000-111721 4/2000--

Signed and Sealed this

Seventeenth Day of March, 2009

JOHN DOLL
*Acting Director of the United States Patent and Trademark Office*